United States Patent [19]

Yoshimura

[11] 4,056,413
[45] Nov. 1, 1977

[54] ETCHING METHOD FOR FLATTENING A SILICON SUBSTRATE UTILIZING AN ANISOTROPIC ALKALI ETCHANT

[75] Inventor: Masayoshi Yoshimura, Hamura, Japan

[73] Assignee: Hitachi, Ltd., Japan

[21] Appl. No.: 729,710

[22] Filed: Oct. 5, 1976

[30] Foreign Application Priority Data

Oct. 6, 1975 Japan .................................. 50-119768

[51] Int. Cl.² ................... H01L 21/302; H01L 21/20; H01L 21/76
[52] U.S. Cl. ...................................... 148/175; 29/580; 29/591; 156/626; 156/647; 156/662; 357/20; 357/34; 357/48; 357/50; 357/60
[58] Field of Search ............... 148/175; 156/626, 647, 156/662; 29/580, 591; 357/48, 50, 20

[56] References Cited

U.S. PATENT DOCUMENTS

| | | | |
|---|---|---|---|
| 3,426,254 | 2/1969 | Bouchard | 357/48 X |
| 3,486,892 | 12/1969 | Rosvold | 156/647 X |
| 3,486,953 | 12/1969 | Ing et al. | 156/647 X |
| 3,664,894 | 5/1972 | Einthoven et al. | 357/48 X |
| 3,728,166 | 4/1973 | Bardell et al. | 148/175 |
| 3,755,012 | 8/1973 | George et al. | 148/175 |
| 3,990,925 | 11/1976 | Erdman et al. | 29/580 X |

OTHER PUBLICATIONS

Lawritzen, P., "Design and Characteazation of . . . Transistor" IEEE Trans. on Electron Devices, vol. ED-15, No. 8, Aug. 1968, pp. 569-576.

Wu, L. L., "Dopep P & N Pockets for Complementary FETS" I.B.M. Tech. Discl. Bull., vol. 15, No. 7, Dec. 1972, p. 2279.

Declercq, M. J., "New C-MOS Technology . . . Etching of Silicon" IEEE J. of Solid-State Circuits, vol. SC-10, No. 4, Aug. 1975, pp. 191-197.

*Primary Examiner*—L. Dewayne Rutledge
*Assistant Examiner*—W. G. Saba
*Attorney, Agent, or Firm*—Craig & Antonelli

[57] ABSTRACT

An epitaxial silicon layer is grown on a principal surface of the (100) crystal face of a silicon single crystal having a depressed portion in the principal surface. The epitaxial silicon layer is flattened by etching, the epitaxial silicon layer being formed to a sufficient thickness so that the side surfaces of the crystal face (111) of a new depressed portion as viewed in a vertical section (the new depressed portion being formed in a surface of the epitaxial silicon layer in correspondence with the first-mentioned depressed portion) intersect at a level which is, at the lowest, the final plane of the etching. The etching is anisotropic etching with an alkali etchant, by which the epitaxial silicon layer is etched down to the final plane.

10 Claims, 7 Drawing Figures

ETCHING METHOD FOR FLATTENING A SILICON SUBSTRATE UTILIZING AN ANISOTROPIC ALKALI ETCHANT

BACKGROUND OF THE INVENTION

1. Field of the Invention

This invention relates to an etching method for flattening a silicon substrate. More particularly, it is directed to etching for flattening a silicon single-crystal layer which is epitaxially grown on a silicon-crystal wafer employed as a substrate.

2. Description of the Prior Art

In the manufacture of a semiconductor integrated circuit device, there is a known process wherein a silicon single-crystal wafer to serve as a substrate is formed with a depressed portion by partial etching. A thick silicon single-crystal layer (doped with an impurity of opposite conductivity type to the substrate) is epitaxially grown on the substrate including the interior of the depressed portion. The uneven surface of the silicon layer as attributed to the depressed portion is flattened from above, and thereafter, necessary circuit elements are respectively formed in the substrate portion and the silicon layer within the depressed portion, isolation being made by a p-n junction.

In order to flatten such an uneven silicon layer, lapping, or the like, mechanical polishing has hitherto been mainly adoapted. The mechanical polishing method, however, involves such disadvantages (1) that after the polishing, crystal defects appear in the flattened silicon surface, (2) that the polishing period of time is considerably long, which incurs an increase in cost, and (3) that the control of the position (thickness) of the final finished surface is difficult. In general, where an epitaxial silicon layer is to be isolated by a p-n junction, especially where the epitaxial layer is thick, the diffusion depth for the isolation is great, so that a long time is required for the formation of an isolation layer. Further, as a consequence of the long time, the diffused isolation layer spreads widely in the lateral direction, and the density of integration is lowered to that extent.

SUMMARY OF THE INVENTION

The present inventor therefore studied the flattening by chemical etching. It has been experimentally confirmed that, where a silicon layer whose principal face is a (100) crystal face is etched with an alkali etchant, the etching rate is greater (about 50:1) for the (100) face than for another crystal face, the (111) face. This characteristic was investigated for flattening-etching.

It is, accordingly, an object of this invention to flatten a silicon single crystal by chemical etching, to thereby achieve p-n junction islation by a small number of steps.

Another object of this invention is to form epitaxial silicon layers of different thicknesses on the surface of a silicon substrate having a depressed portion.

Still another object of this invention is to form different circuit elements within the different epitaxial silicon layers, respectively.

The construction of this invention for accomplishing the objects is characterized in that an epitaxial silicon layer is grown on a aprincipal face of a silicon single crystal which is the (100) crystal face, the silicon single crystal having a depressed portion in its principal face. To flatten the epitaxial silicon layer, etching is carried out, the epitaxial silicon layer being formed to a sufficient thickness that a position, at which the side surfaces of a new depressed portion to be formed in a surface of the epitaxial silicon layer (said side surfaces having the face (111) intersect, becomes at least a final surface of the etching, whereupon anisotropic ethcing with an alkali etchant is performed for the epitaxial silicon layer down to the final surface. This method enalbes one to flatten the silicon single crystal by etching and to realize isolation by a small number of steps.

DETAILED DESCRIPTION OF THE INVENTION

FIGS. 1(a) to 1(e) illustrate sequential steps of the invention for isolating an $n^-$- type well region which is formed by the epitaxial process on a $p^-$- type silicon single crystal wafer employed as a substrate.

Figure 1A:
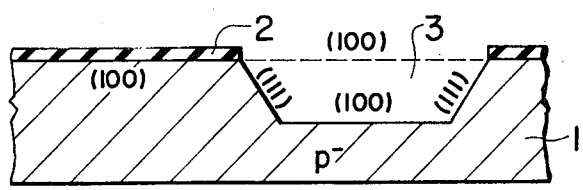
FIGS. 1(a) to 1(e) are sectional views of a simiconductor device at various steps of an embodiment of the flattening etching according to this invention.

FIG. 1(a) illustrates a silicon wafer 1 prepared as a substrate by slicing a $p^-$- type silicon single crystal so that the principal face may become the (100) face. A silicon oxide ($SiO_2$) film 2 is formed on the surface by thermal oxidation. A part of the oxide film is removed by photoetching. Thereafter, using the remaining oxide film as a mask, the silicon wafer 1 is etched to form a depressed portion 3. Although the etching may be conventional utilizing an HF (hydrofluoric acid) series etchant, anisotropic etching with an alkali etchant is adopted in this case. Thus, as shown in the figure, the (100) face is deeply etched, and the flat (111) face having a predetermined angle is obtained on the side wall of the depressed portion 3.

Figure 1B:
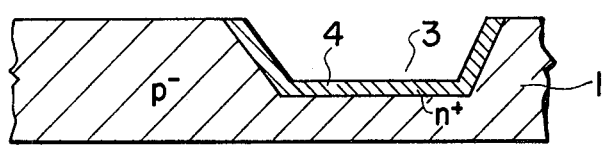

As shown in FIG. 1(b), using the oxide film as a mask, an $n^+$- type buried layer 4 is formed along the surface of the depressed portion 3 by the selective diffusion of a donor such as boron at a high concentration. After the donor diffusion, the oxide film 2 is removed by etching.

Figure 1C:
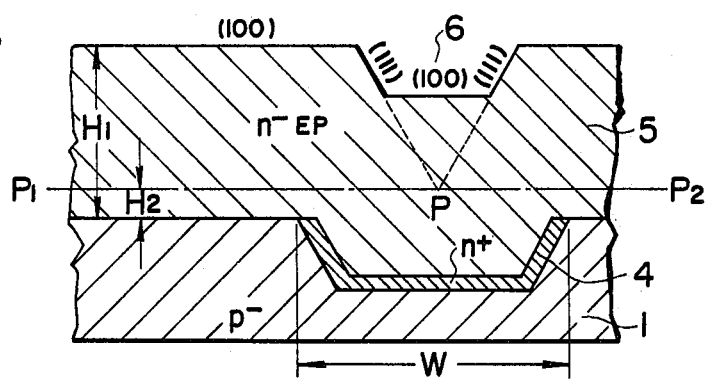

Next, as illustrated in FIG. 1(c), the resultant silicon wafer 1 is caused to react with a silicon compound such as $SiCl_4$ and $SiH_4$ and is simultaneously doped with a donor, to thickly form an $N^-$- type epitaxial silicon layer 5. The thickness of the $n^-$- type epitaxial silicon layer is determined as described below.

Suppose the state under which, as shown in FIG. 1(c), the epitaxial silicon layer 5 is formed sufficiently thickly. At that time, a new depressed portion 6 is formed in the surface of the silicon layer in correspondence with the depressed portion 3. The side surface of the depressed portion 6 has the (111) face inclined at an angle equal to that of the side surfaces of the depressed portion 3. Here, the two opposing side surfaces of the depressed portion 6 are extended towards the substrate, and the position at which they intersect is a point P. The epitaxial growth shall be made so that the point P may lie on the final cut line (line $P_1 - P_2$) which is set as the final etching level in the subsequent etching. The thickness $H_1$ of such epitaxial growth can be theoretically or experimentally calculated on the basis of a thickness $H_2$ from the surface of the silicon wafer 1 to the line $P_1 - P_2$, the dimension W of the depressed portion 3, etc. The epitaxial growth is carried out by controlling the epitaxial reaction temperature, the concentration of $SiH_4$, the period of time, etc.

Figure 1D:
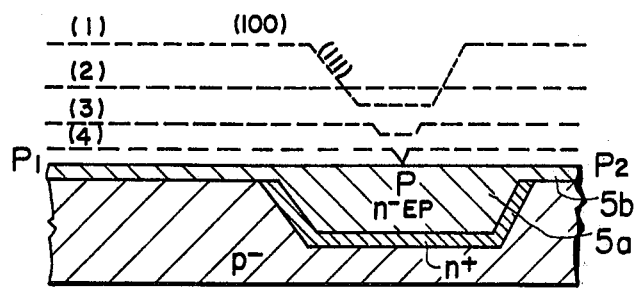

Thereafter, as shown in FIG. 1(d), the epitaxial silicon layer is subjected to anisotropic etching with an alkali etchant, to remove the silicon layer down to the line $P_1 - P_2$. The alkali etchant may be, for example, a 40% solution of KOH. It etches the (100) face at a rate of about 1μ per minute. According to such anisotropic etching, owing to the fact that the etching rate for the (100) face is conspicuously greater than the etching rate for the (111) face of the side surfaces of the depressed portion 6 (about 50:1), the etching in the lateral direction is only slight. As illustrated by broken lines (1), (2), (3), ... in FIG. 1(d), as the etching becomes deeper, the depressed portion becomes smaller along the extension surface of the initial side surface. Finally, the depressed portion disappears at the point P. Thereafter, the epitaxial silicon layer 5 is etched under the state under which the silicon surface is kept flat. In this way, an n⁻⁻- type silicon layer which consists of a deep silicon layer 5a at the depressed portion 3 and a shallow silicon layer 5b on the surface of the silicon substrate and which has a common flat principal face is obtained on the substrate 1.

Figure 1E:
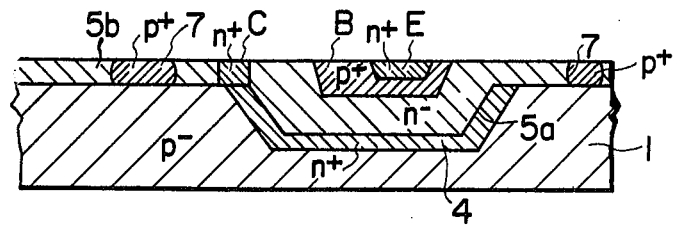

Finally, as shown in FIG. 1(e), a p⁺- type isolation region 7 is formed in the n⁻⁻- type silicon layer 5b so as to surround the deep silicon layer 5a by the selective diffusion of an acceptor. Simultaneously with the diffusion of the p⁺- type base region, a p⁺- type base region is diffused in the deep region 5a. Subsequently, the diffusion on an n⁺- type emitter in the base region and that of an n⁺- type collector contact portion to be connected with the n⁺- type buried region are carried out. Thus, a bipolar transistor which has a base B, an emitter E and a collector contact portion C is obtained.

According to the invention described above, its objects can be accomplished for the reasons stated below.

The principal in which, by exploiting the anisotropic etching, the epitaxial silicon layer can have the depressed portion removed and be flattened, is apparent from the explanation and illustration of the step (d). It is also apparent that the etching is effected by the mere immersion in the etchant without especially requiring a mask and that the control of the depth is very easy. It is also apparent from the explanation and illustration of the step shown in FIG. 1(e) that the number of steps can be reduced by executing the diffusion of the isolation region and that of the base, and the diffusion of the collector contact portion and that of the emitter at the same time.

Figure 2:
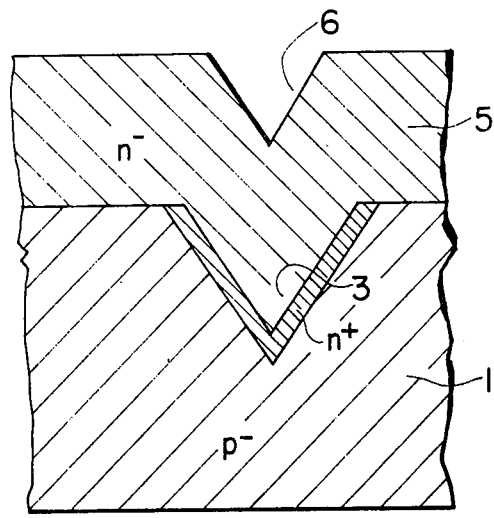
FIGS. 2 and 3 are sectional views each showing a semiconductor device at one step of another embodiment.
Figure 3:
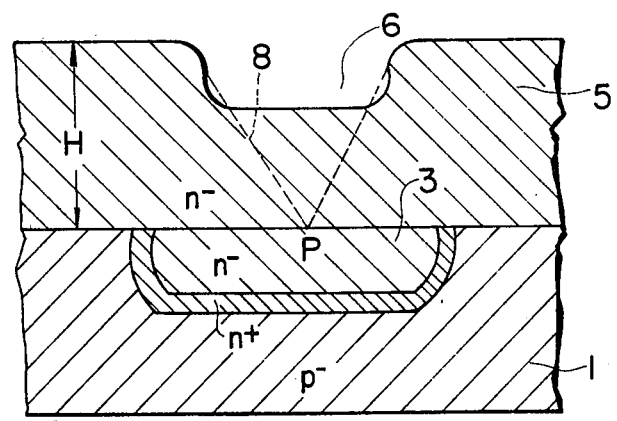

The invention is not restricted to the foregoing embodiment, but it can be performed in a variety of different aspects. The form of the depressed portions of the silicon wafer and the epitaxial silicon layer grown thereon may be of a V-shaped notch as shown by way of example in FIG. 2. The final etching surface may well coincide with the substrate surface. In case where, as illustrated in FIG. 3, the depressed portion 3 of the silicon wafer 1 is formed by the conventional etching and the epitaxial silicon layer 5 is grown thereon, the depressed portion 6 does not always have the (111) face on the side surface thereof. Even in this case, when the anisotropic etching is carried out, the depressed portion is reduced along a broken line 8 in the figure and disappears at a point P. The thickness H of the epitaxial silicon layer 5 in this case can be theoretically or experimentally evaluated from the dimension of the depressed portion 3 and the position of the point P.

In particular, according to this invention, in case of a power integrated circuit (IC), it is possible to form an element for high power within the deep epitaxial region and an element for a small signal within the shallow region. Thus, an unnecessarily thisk epitaxial layer need not be formed for the element for a small signal.

The element which is formed within the silicon layer of the depressed portion after the flattening etching may well be a MOS element rather than the bipolar element.

This invention is applicable to a linear IC, a MOSIC, a hybrid IC thereof, and all the other ICs.

While I have shown and described an embodiment in accordance with the present invention, it is understood that the same is not limited thereto but is susceptible of numerous changes and modifications as known to a person skilled in the art, and I therefore do not wish to be limited to the details shown and described herein but intend to cover all such changes and modifications as are obvious to one of ordinary skill in the art.

I claim:

1. An etching method for flattening a silicon substrate wherein an epitaxial silicon layer is grown on the (100) crystal face of the silicon single-crystal substrate, the silicon single-crystal substrate having a depressed portion in its principal face, and etching for flattening the epitaxial silicon layer is carried out; said method comprising the steps of forming said epitaxial silicon layer to such a sufficient thickness that a position at which side surfaces of a new depressed portion to be formed in a surface of said epitaxial silicon layer, said side surface having a crystal face (111), intersect becomes at least a final surface of the etching, and subjecting said epitaxial silicon layer to anisotripic etching with an alkali etchant down to said final surface.

2. A method of manufacturing a semiconductor device wherein an epitaxial silicon layer is grown on a principal face of a silicon single-crystal substrate which is the (100) crystal face, the silicon single-crystal substrate having depressed portions in its principal face, and etching for flattening the epitaxial silicon layer is carried out; comprising the steps of forming said epitaxial silicon layer to such a sufficient thickness that a position at which side surfaces of each of new depressed portions to be formed in a surface of said epitaxial silicon layer, said side surface having a crystal face (111), intersect becomes at least a final surface of the etching, subjecting said epitaxial silicon layer to anisotropic etching with an alkali etchant, and subsequently doping selected parts of said epitaxial silicon layer outside a surface of said depressed portion of said substrate with an impurity of the same conductivity type as that of said substrate to the extent that the impurity-doped layers extend to said substrate.

3. The method of manufacturing a semiconductor device as defined in claim 2, further comprising the step of forming a desired circuit element in each of the large number of epitaxial silicon layers which are electrically isolated by said impurity-doped layers.

4. The method of manufacturing a semiconductor device as defined in claim 3, wherein an element for power is formed within the deep epitaxial silicon layer, while an element for a small signal is formed within the shallow portion.

5. A method of manufacturing a semiconductor device comprising the steps of:
 a. removing a prescribed portion of semiconductor material from the (100) crystal face of a silicon single crystal substrate so as to form a depression in said substrate;

b. epitaxially growing a silicon layer on said (100) crystal face and in the depression of said substrate so as to fill said depression and so that said layer extends above the original (100) crystal face of said substrate while leaving a depression in said silicon layer above the depression in said substrate; and c. subjecting said epitaxially grown silicon layer to anisotropic etching with an alkali etchant; and wherein step (b) comprises epitaxially growing said silicon layer to a thickness such that lines extending along the side surfaces of the depression in said silicon layer, as said silicon layer is etched by said alkali etchant, intersect at a point no deeper from the surface of said silicon layer than the extent to which said silicon layer is etched.

6. A method according to claim 5, wherein said silicon single crystal substrate has a first conductivity type, and further comprising the step (d) of forming, prior to step (b), a high impurity concentration layer of a second conductivity type, opposite said first conductivity type, in the depression in said substrate.

7. A method according to claim 6, wherein step (d) comprises introducing an impurity of said second conductivity type into the bottom and side walls of the depression in said substrate.

8. A method according to claim 7, wherein said silicon layer has said second conductivity type and further comprising the step (e) of forming a prescribed circuit element in that portion of the etched silicon layer overlying the depression on said substrate, subsequent to step (c).

9. A method according to claim 8, further comprising the step (f) of introducing an impurity of said first conductivity type into a portion of said silicon layer surrounding said circuit element so as to provide PN junction isolation for said circuit element.

10. A method according to claim 5, wherein the side walls of the depression in said silicon substrate lie in the (111) crystal face of said substrate.

* * * * *